(12) United States Patent
Mactaggart

(10) Patent No.: US 8,319,563 B2
(45) Date of Patent: Nov. 27, 2012

(54) DIGITALLY CONTROLLED OSCILLATOR

(75) Inventor: Iain Ross Mactaggart, Eden Prairie, MN (US)

(73) Assignee: Fmax Technologies, Inc., Eden Prairie, MN (US)

( * ) Notice: Subject to any disclaimer, the term of this patent is extended or adjusted under 35 U.S.C. 154(b) by 0 days.

(21) Appl. No.: 13/044,112

(22) Filed: Mar. 9, 2011

(65) Prior Publication Data

US 2011/0221492 A1    Sep. 15, 2011

Related U.S. Application Data

(60) Provisional application No. 61/340,026, filed on Mar. 12, 2010.

(51) Int. Cl.
*H03L 7/08* (2006.01)
*H03K 5/13* (2006.01)

(52) U.S. Cl. .................. 331/45; 331/1 A; 327/156

(58) Field of Classification Search .............. 331/45, 331/1 A
See application file for complete search history.

(56) References Cited

U.S. PATENT DOCUMENTS

| | | | |
|---|---|---|---|
| 3,976,945 A | 8/1976 | Cox | |
| 5,838,755 A | 11/1998 | Tammelin | |
| 2006/0285615 A1* | 12/2006 | Comer et al. | 375/354 |
| 2011/0199128 A1* | 8/2011 | Turner | 327/106 |

\* cited by examiner

*Primary Examiner* — Joseph Chang
(74) *Attorney, Agent, or Firm* — Schwegman Lundberg Woessner P.A.

(57) ABSTRACT

Embodiments of a device and circuit implementing a digitally controlled oscillator with reduced analog components. In an example, the digitally controlled oscillator can include a phase accumulator controlled by a stall circuit to selective stall the phase accumulator. In some examples, the digitally controlled oscillator can include a phase select circuit to select multiple phases of a phase select circuit based on the output of the phase accumulator. In some examples, these selected phases can then be used by a phase interpolator to generate a synthetic clock signal.

20 Claims, 4 Drawing Sheets

DIGITALLY CONTROLLED OSCILLATOR

PRIORITY APPLICATION

This application claims the benefit of priority under 35 U.S.C. 119(e) to U.S. Application Ser. No. 61/340,026 filed on Mar. 12, 2010, which is incorporated herein by reference in its entirety.

BACKGROUND

Conversion of a digital number into a clock signal having a frequency that has a mathematical relationship to (e.g., proportional) the digital number is a widely used technique in modern electronics. One circuit that can make use of this conversion is a phase-locked loop (PLL). In an example, a digital PLL can convert the digital number that represents clock frequency into a voltage or current using a digital-to-analog converter (D2A) and then uses the resulting analog voltage or current to control an analog voltage or current controlled oscillator.

FIG. 1 illustrates another technique known as direct digital synthesis (DDS) 100. DDS uses a digital accumulator 102 which is clocked by a fixed clock 104 (usually quartz oscillator derived). This fixed clock 104 (also referred to herein as a "master clock") is used to create an output clock signal 106 (also referred to herein as a "synthesized clock") at the desired frequency. A DDS 100 accepts a number (also referred to herein as a frequency control word (n)) into the accumulator 102 which represents a phase step that is applied every master clock cycle. Once the accumulator 102 is full, overflow occurs and the most significant carry out is discarded. This condition corresponds to the phase output of the accumulator having traversed fully 360 degrees and with the overflow, returning to a small phase value. This process is continually repeated. The required number of most-significant sums from this accumulator 102 can be tapped to provide whatever phase resolution is required. Instantaneous phase may then be converted to instantaneous amplitude using a sin or cosine read-only-memory (ROM) look up table 108. This digital amplitude data may then be converted to an analog quantity using a D2A 110. After the D2A 110, using analog filters 112, the signal may be filtered to produce a final sin or cosine waveform.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A conventional PLL can have the disadvantage that the resulting frequency is not stabilized with respect to process, voltage, and temperature (PVT), due in part to the analog techniques used. The heavy reliance on analog techniques also makes these circuits less portable from one technology to another. Additionally, for practical use of a voltage or current controlled oscillator, a D2A should have a very high resolution making the circuit inherently complex and process sensitive.

Figure 1:
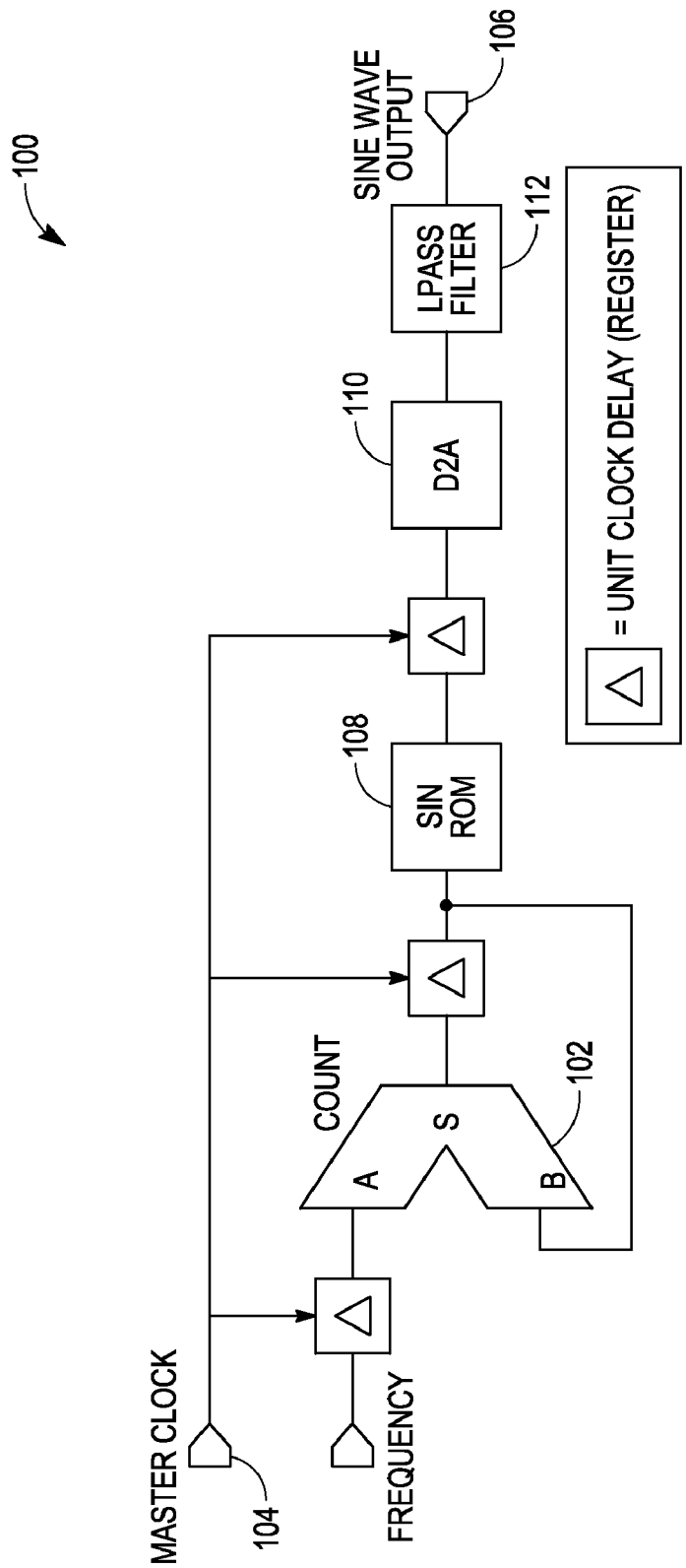
FIG. 1 illustrates an example of a direct digital synthesis (DDS) circuit.

Additionally, the DDS technique shown in FIG. 1 relies on Nyquist theory which allows a continuous waveform to be derived from instantaneous periodic samples that represent amplitude at an instant of time. The post-filtered continuous sine/cosine waveform may then be converted to a square wave as would normally be required. Here again, however, high precision analog circuitry is required (e.g., D2A, Nyquist filter) and the analog circuitry is performance limiting by the practical roll-off characteristics of the filter being less steep than the ideal "brick-wall" response. A convention DDS is also limited by Nyquist theory itself, which limits the output synthetic clock frequency to be less than half of the master clock frequency. This theoretical limitation, known as the Nyquist criterion, and the practical limitation relating to the rate of filter roll-off, limits this art to producing a synthesized clock that is a fraction of the master clock frequency. This fraction is typically less than 25% in most practical realizations. This makes the clock synthesis approach inefficient in terms of power and integrated circuit (also refer d to herein as chip) area in many circuit applications.

There are also solutions where cycle swallowing (cycle skipping) is used to generate a new frequency. One example of this is a sigma-delta fractional PLL which makes use of controlled cycle swallowing to generate an average frequency that lies between two integer values. This frequency is then applied to a phase detector within a PLL. In this architecture, a divide by (N/N+1) is used to divide down a high frequency voltage controlled oscillator (VCO). The divider control that determines the divide value is typically controlled by the sigma-delta modulator. In these solutions, the PLL bandwidth is set to a low value such that high frequency noise in the sigma-delta modulator is heavily attenuated and the VCO settles at a fractional frequency. These solutions also require a good low noise oscillator, as PLL loop bandwidths are inherently low.

U.S. Pat. No. 3,976,945 entitled "Frequency Synthesizer", issued Aug. 24, 1975 uses a method of cycle swallowing to modify, (lower) the frequency of a high speed clock by using a phase accumulator to swallow a master clock cycle every time there is a carry-out in a phase accumulator. This method allows the frequency of the master clock to be reduced from a maximum value of 100% to a lower value by the rate at which the phase accumulator cycles through 360 degrees. This architecture is therefore capable of generating a synthetic clock that is up to 100% of the master clock frequency. This frequency can be as precisely controlled as in a DDS, however, the very large phase jumps in the output clock must be corrected to generate a useful spectrally clean synthetic clock. This patent also describes how the phase information in the phase accumulator may be used to make this correction. This results theoretically no phase error in the resulting synthetic clock, subject to the resolution of the digitally controlled delay circuit. To achieve the digitally controlled delay function of these solutions, a D2A, a precision current source, a switch, and a d-type flip-flop are used. This, however, still requires significant analog components.

In other work, U.S. Pat. No. 5,838,755 issued Nov. 17, 1998, entitled "Frequency Forming Circuit with Pulse Swallower" shows the use of a Delay Locked Loop and Calibration Circuit to synthesize a fractional frequency. This method, however, does not include the use of a phase accumulator making it unsuitable for integration into a Digital Phase Locked Loop. Here, the delay locked loop suffers from a phase error step between the beginning and the end of the delay line due to phase detector offsets and furthermore, phase noise will tend to build up in the delay line as the clock wavefront traverses the delay line. This is due to both transistor noise and power supply noise.

The present inventors have recognized, among other things, systems and circuits for a digitally controlled oscillator that reduces analog content.

Figure 2:
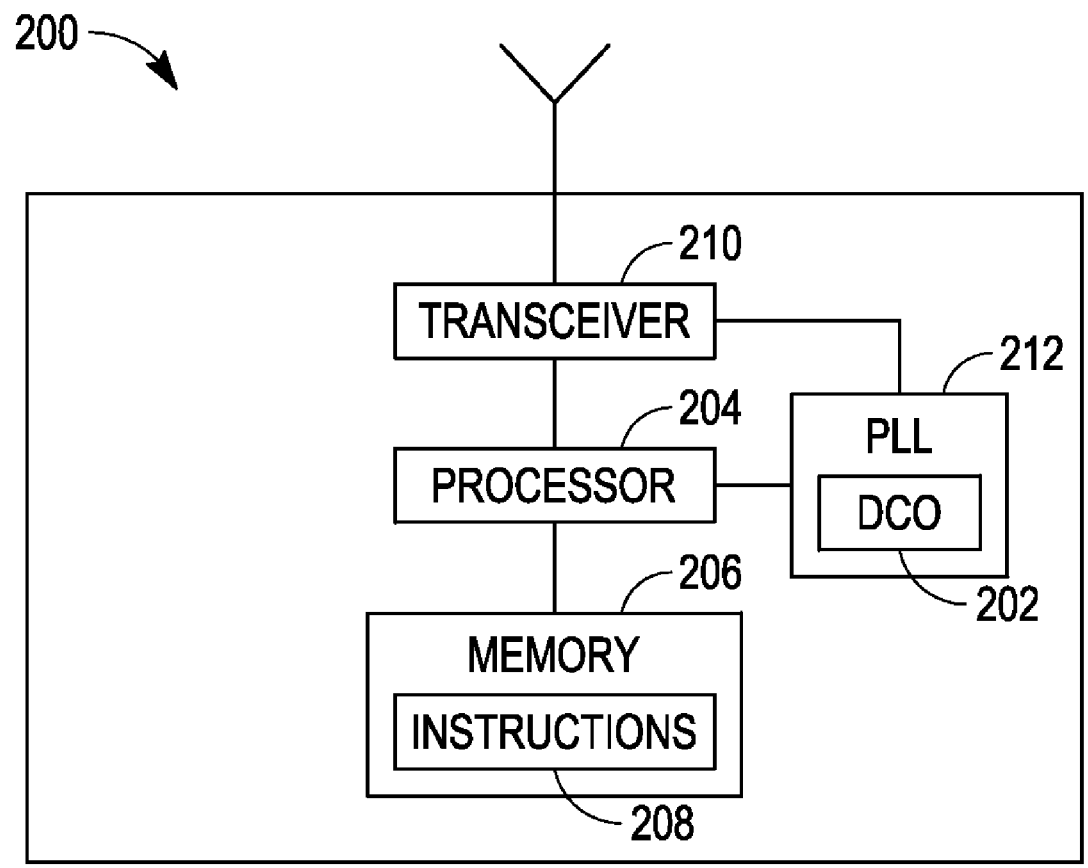
FIG. 2 illustrates an example of a digital computer device having a clock generated by a digital phase-locked loop.

FIG. 2 illustrates one example of a digital computer device 200 including a digitally controlled oscillator 202. The digital computer device 200 includes a processor 204 coupled to a memory 206. The memory 206 can include instructions 208 which, when executed by the processor 204, are configured to perform certain functions. In addition to the processor 204 and memory 206, the digital computer device 200 can include other digital components 210 to perform various tasks. For example, the other digital components 210 can include a transceiver, digital signal processor (DSP), logic elements, mixers.

The processor 204, memory 206 and other digital components 210 can operate based on one or more clock signals. One such dock signal can be generated by a phase-locked loop (PLL) 212. In an example, the PLL 212 generates a local oscillator for up-conversion and down-conversion during transmission and reception of radio frequency signals. The PLL 212 can include a digitally controlled oscillator 202 coupled in a feedback configuration to generate a synthesized clock signal. The digitally controlled oscillator 202 can control the frequency of the synthetic clock signal as a function of a frequency control word input into the digitally controlled oscillator 202. In this way a desired synthetic frequency can be generated by the PLL 212.

Examples of a digital computer device 100 can include a wireless telephone (e.g., a smart phone, etc.), a personal computer, a tablet computer, a personal digital assistant (PDA), a laptop computer, a net-book, a wireless headset, a pager, an instant messaging device, a digital camera, an access point, a television, a medical device (e.g., a heart rate monitor, a blood pressure monitor, etc.), a remote control, or other digital electronic device.

Figure 3:
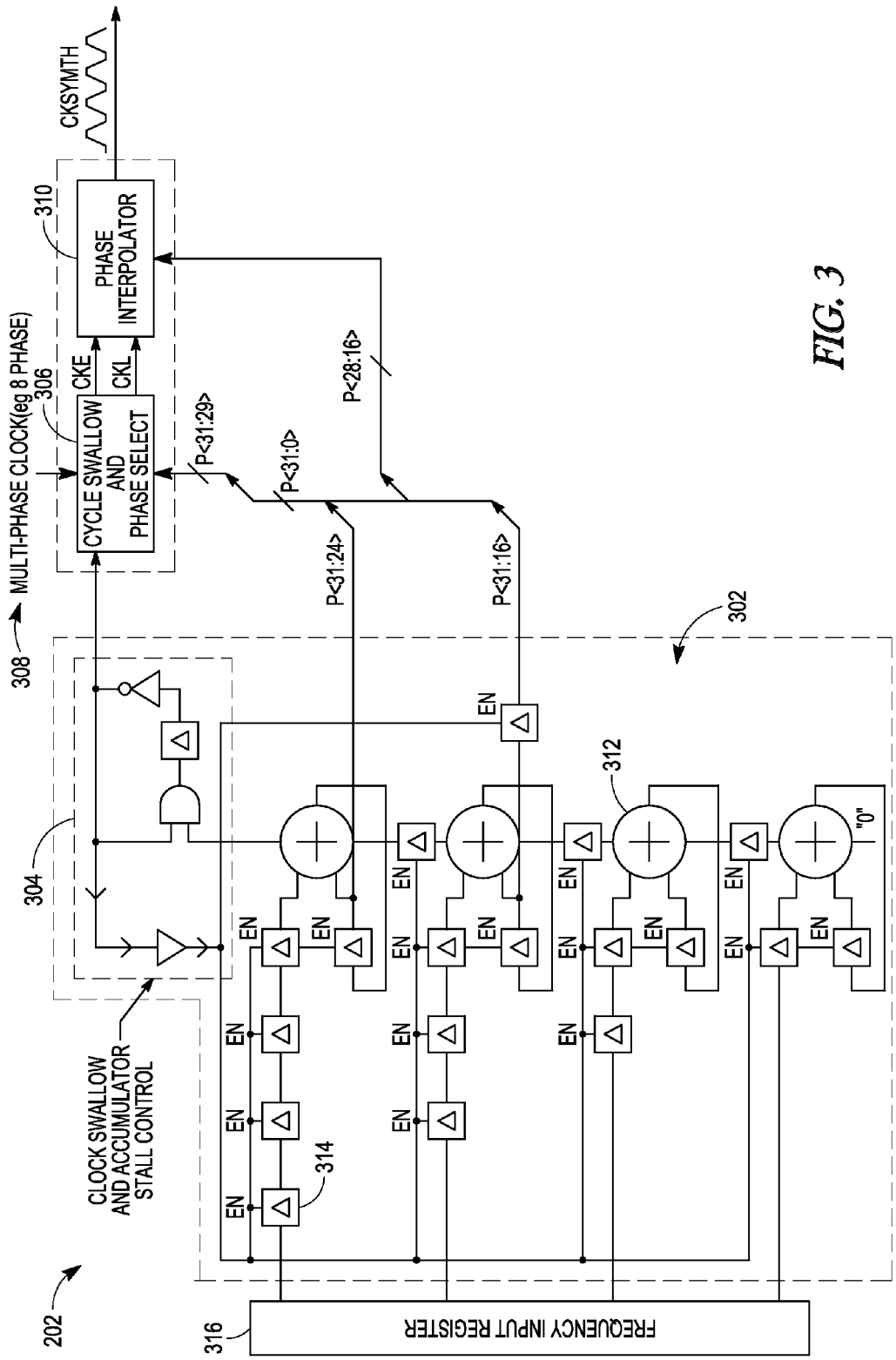
FIG. 3 illustrates an example of a digitally controlled oscillator.

FIG. 3 illustrates an example of a digitally controlled oscillator 202. The digitally controlled oscillator 202 can include a phase accumulator 302 coupled to an accumulator stall circuit 304 and a phase select circuit 306. The digitally controlled oscillator 202 can also include a multiphase master clock 308 and a phase interpolator 310.

In an example, the phase accumulator 302 comprises a pipelined phase accumulator having a plurality of stages 312. The phase accumulator 302 can include a plurality of registers 314 for holding values between processing by the phase accumulator 302. In an example, one or more of the registers 314 hold/delay the input frequency control word from the frequency input register 316. This hold/delay enables each stage 312 of the phase accumulator 302 to delay and process the values correspondingly. The phase accumulator 302 outputs one or more output bits based on an input (e.g., the frequency control word). In an example, the output bits comprise the sum output from the adders in the phase accumulator 302. These output bits include the carry-out (e.g., overflow) bit from the highest stage 312 of the phase accumulator 302. As known to those skilled in the art, the output bits can be characterized from a most significant bit (MSB) to a least significant bit (LSB). As used herein, the MSB is the carry-out bit from the highest stage 312. In this example, the phase accumulator 302 outputs bits 0 through 32, wherein the carry-out bit is number 32. Accordingly, the next most significant bit after the carry-out is bit 31, and so on. Although the example shown in FIG. 3 includes 4 stages 312, it should be understood that in other examples, a different number of stages 312 can be used. Moreover, in some examples, the phase accumulator 302 is a non-pipelined phase accumulator.

The stall circuit 304 can be configured to selectively stall the accumulator 302 from accepting an input (e.g., the frequency control word). In an example, the stall circuit 304 can be controlled based on one or more output bits from the phase accumulator 302. For example, the stall circuit 304 can receive one or more of the MSBs (also referred to herein as the "S MSBs") from the phase accumulator 302 and stall the phase accumulator 302 based on those bits. In some examples, the stall circuit 304 does not receive the MSB (the carry-out), but receives one or more of the next MSBs after the MSB. As should be understood, there are several methods of controlling the stall circuit 304 based on the output from the phase accumulator 302.

When stalled, the output value from the accumulator 202 is held constant. In an example, the accumulator stall circuit 304 stalls the accumulator 302 by disabling one or more of the registers 314. When the registers 314 are disabled, the accumulator 302 does not accept an input from the frequency register 316. The stall circuit 304 can stall the phase accumulator 302 for one or more cycles based on the output of the phase accumulator 302.

The phase select circuit 306 is configured to select one or more phases of a multiphase clock signal for sending to the phase interpolator 310. The phase select circuit 306 is coupled to the multiphase clock 308 and receives the multiphase clock signal therefrom. In an example, the multiphase clock signal includes a plurality of clock signals having the same frequency and offset by a portion of a clock cycle. For example, for an 8 phase multiphase clock 308, the multiphase clock signal includes 8 different clock signals of the same frequency, wherein each clock signal is offset from a previous clock signal by 45 degrees. Accordingly, one cycle from each clock (8 signals total) is included in a single multiphase clock cycle. An individual clock signal (e.g., one of the 8 different clock signals) that makes up the multiphase clock signal is referred to herein as a phase of the multiphase clock signal.

The phase select circuit 306 can select the one or more phases based on an output from the phase accumulator 302. In an example, the phase select circuit 306 selects the one or more phases based on the M MSBs after the S MSBs from the output of the phase accumulator 302. That is, if the output of the phase accumulator 302 includes 32 bits, with the 8 MSBs (25-32) sent to the stall circuit 304, and the next 3 MSBs (22-24) sent to the phase select circuit 306, the S MSBS equals bits 35-32 and the M next MSBs equals bits 22-24.

These M next MSBs are used to select one of N (e.g., 8) phases in the multiphase clock signal which now has a clock cycle missing (swallowed). These M next MSBs are used to effect a coarse phase correction of the synthetic clock signal. A multiplexer that is used to make this multiphase clock selection can also pick an adjacent multiphase clock phase. This results in two clock phases being output from the phase select circuit 306. The earlier phase is referred to herein as an early clock signal (CKE in FIG. 3) and the later phase is referred to herein as a late clock signal (CKL in FIG. 3). These clocks are then phase interpolated by the phase interpolator 310 under control of the next P most significant bits after the M most significant bits used by the phase select circuit 306) of the output from the phase accumulator 302. That is, if the output of the phase accumulator 302 includes 32 bits, with the 8 MSBs (25-32) sent to the stall circuit 304, the next 3 MSBs (22-24) sent to the phase select circuit 306, and the next 8 MSBs (15-22) sent to the phase interpolator 310, the S MSBs equals bits 35-32, the M next MSBs equals bits 22-24, and the P next MSBs equal bits 15-22.

In addition to stalling the phase accumulator 302, the stall circuit 304 can inhibit the phase select circuit 306 from selecting a phase based on the output from the phase accumulator 302. Inhibiting the phase select circuit 306 prevents the phase select circuit 306 from outputting a signal to the phase interpolator 310. In an example, the stall circuit 304 inhibits the phase select circuit 306 from selecting a phase whenever the stall circuit 304 stalls the phase accumulator 302. Accordingly, the stall circuit 304 can simultaneously stall the phase accumulator 302 and inhibit the phase select circuit 306 for one or more clock cycles in order to delay a signal to the phase interpolator 310.

In operation, a two-step process is used by the digitally controlled oscillator 202 to implement a digitally controlled phase selection and adjustment of the multiphase master clock 308. In the first step, a coarse phase select of the multiphase master clock 308 is made using the M most significant bits from the output of the phase accumulator 302. These M most significant bits are used to create two clocks, an early and late clock that are one phase of the multiphase master clock apart. That is, the early clock and the late clock comprise adjacent clock signals from the multiphase master clock. In an example of an 8 phase master clock, the early clock would be (360/8)=45 degrees ahead of the late clock.

In the second step, the early and late clock are passed on to a second stage that can include the phase interpolator 310. The phase interpolator 310 can interpolate the early and late clock phases to provide a fine phase adjustment that completes the phase error correction.

Figure 4:
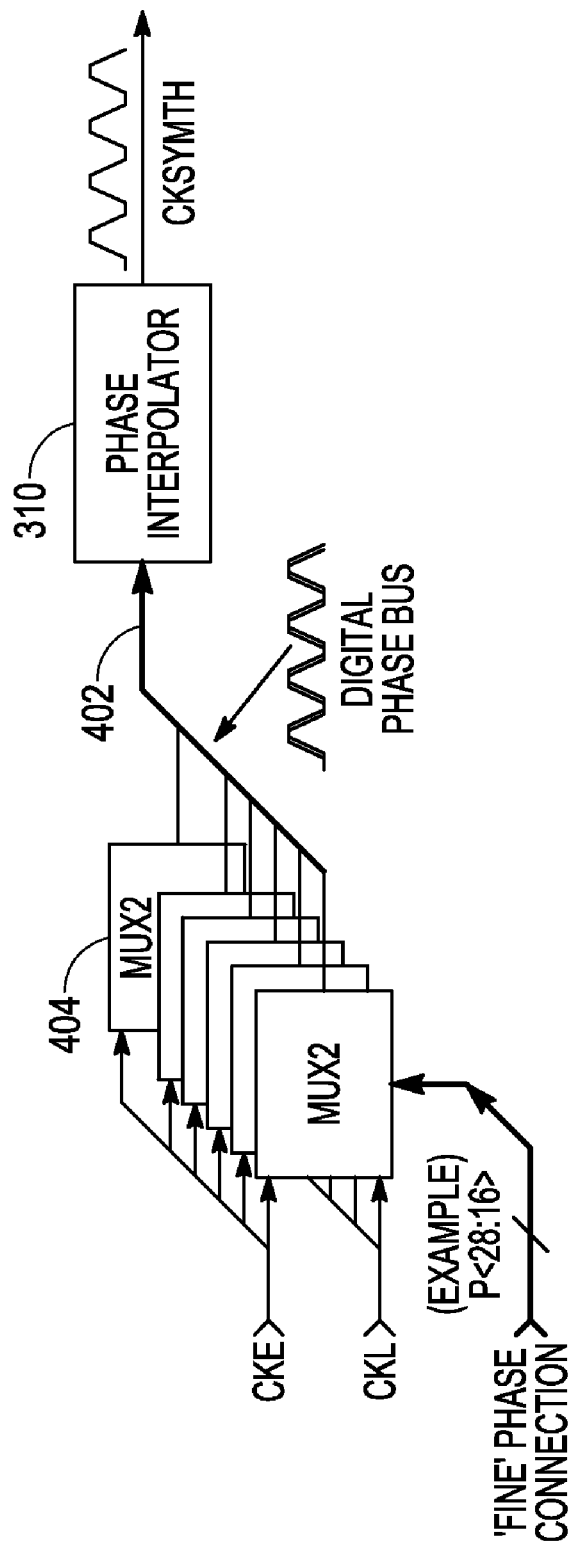
FIG. 4 illustrates an example of a digital phase bus.

FIG. 4 illustrates an example of a digital phase bus 402 that can be used to transfer the early and late clock from the phase select circuit 306 to the phase interpolator 310. In an example, the digital phase bus 402 can have each bit corresponds to the early or late clock and has binary weighted significance. For example, the multi-bit digital bus 402 can include the early and late clock signals encoded with a power-of-2 significance. As shown a plurality of multiplexers 404 can provide the signal early and late clock signals to the digital bus 402.

Advantageously, this design enables the digital signals and components of the controlled oscillator 202 to be implemented on a single monolithic integrated circuit. Moreover, this monolithic integrated circuit can be implemented such that no analog components are included on the monolithic integrated circuit. The monolithic integrated circuit can include the phase accumulator 302, the stall circuit 304, the phase select circuit 306, and the digital phase bus 402. This monolithic integrated circuit can have one or more output pins that can be coupled to an off-chip interpolator to be used to generate a synthetic clock with a precise phase. Notably, the digital multi-bit weighted bus can enable an (external) phase interpolation function to be implemented with a simple off-chip interpolator.

In an example, the digitally controlled oscillator 202 can output a synthetic clock signal that has zero phase error except for phase quantization and non-idealities implementation. The number M of bits used for the coarse phase selection (e.g., the number M of most significant bits from the output of the phase accumulator 302 to select the phase in the phase select circuit 306) together with the number P of bits used for fine phase selection (e.g., the number P of next most significant bits from the output of the phase accumulator 302 used by the phase interpolator 310) can determine the phase accuracy of the resulting synthetic clock. For example, a 3 bit coarse phase select of an 8 bit (phase) multiphase clock, followed by a 9 bit phase interpolator would yield an overall 3+9=12 bit phase control of the multiphase clock 308. This would yield a period jitter of 1/4096 of the multiphase clock cycle. For a 2 ns multiphase clock cycle, this would correspond to approximately 500 fs phase quantization.

The digitally controlled oscillator 202 has numerous applications including many applications in wireless signal transmission and reception as well as in digital PLLs in monolithic integrated circuit design. In an example, the increased digital components and reduced analog components of the digitally controlled oscillator 202 make is well suited to being applied in various integrated circuit technologies. Moreover, due in part to the increased digital components and ability to implement on a single monolithic integrated circuit, the digitally controlled oscillator 202 also lends itself to low power PLL solutions, and frequency hopping wireless architectures due to the minimal signal processing used.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A circuit comprising:
   a phase accumulator configured to receive a first clock signal, the phase accumulator having a plurality of registers, wherein one or more of the registers are configured to accept a frequency control word;
   a stall circuit configured to selectively disable one or more of the registers in order to stall the phase accumulator; and
   a phase select circuit configured to select one or more phases based on one or more output bits from the phase accumulator.

2. The circuit of claim 1, comprising:
   a multiphase clock generator; and
   wherein the phase select circuit is configured to receive a multiphase clock signal from the multiphase clock generator, and to select the one or more phases from the multiphase clock signal based on the one or more output bits from the phase accumulator.

3. The circuit of claim 2, comprising:
   a phase interpolator coupled to an output of the phase select circuit.

4. The circuit of claim 3, wherein the phase interpolator is configured to allow a large range in output frequency by permitting unconstrained phase steps.

5. The circuit of claim 3, wherein phase interpolator is configured to output a synthetic clock signal having a frequency that is a function of the frequency control word.

6. The circuit of claim 3, wherein the stall circuit is coupled to one or more of the S most significant bits (MSBs) of an output from the phase accumulator, and wherein the stall circuit is configured to disable the phase accumulator based on one or more of the S MSBs.

7. The circuit of claim 6, wherein the phase select circuit is coupled to the stall circuit, and wherein the stall circuit is configured to inhibit the phase select circuit from outputting a signal to the phase interpolator when the stall circuit disables the phase accumulator.

8. The circuit of claim 6, wherein the M next MSBs after the S MSBs of the output from the phase accumulator are used to select a phase in the phase select circuit.

9. The circuit of claim 3, wherein the phase select circuit is configured to output an early clock signal and a late clock signal based on the output from the phase accumulator, wherein the late clock signal is one phase of the multiphase clock signal after the early clock signal.

10. The circuit of claim 3, wherein the phase interpolator is configured to interpolate the early clock signal and the late clock signal as a function of the P next MSBs after the M next MSBs of the output of the phase accumulator.

11. The circuit of claim 1, wherein the phase accumulator includes a plurality of stages configured to pipeline the phase accumulator.

12. A phase-locked loop for generating a synthetic clock signal, the phase-locked loop comprising:
 a phase accumulator having a plurality of registers, wherein one or more of the registers are configured to accept a frequency control word;
 a stall circuit configured to selectively disable one or more of the registers in order to stall the phase accumulator;
 a multiphase clock generator; and
 a phase select circuit coupled to a multiphase clock signal from the multiphase clock generator, wherein the phase select circuit is configured to select one or more phases from the multiphase clock signal based on one or more output bits from the phase accumulator.

13. The phase-locked loop of claim 12, wherein the stall circuit is coupled to one or more of the S most significant bits (MSBs) of an output from the phase accumulator, and wherein the stall circuit is configured to disable the phase accumulator based on one or more of the S MSBs.

14. The phase-locked loop of claim 13, wherein the phase select circuit is coupled to the stall circuit, and wherein the stall circuit is configured to inhibit the phase select circuit from outputting a signal to the phase interpolator when the stall circuit disables the phase accumulator.

15. The phase-locked loop of claim 13, wherein the M next MSBs after the S MSBs of the output from the phase accumulator are used to select a phase in the phase select circuit.

16. The phase-locked loop of claim 12, wherein the phase select circuit is configured to output an early clock signal and a late clock signal based on the output from the phase accumulator, wherein the late clock signal is one phase of the multiphase clock signal after the early clock signal.

17. A digital computer device comprising:
 a processor; and
 a phase-locked loop for generating a synthetic clock signal, the phase-locked loop including:
  a phase accumulator having a plurality of stages configured to pipeline the phase accumulator, the phase accumulator having a plurality of registers, wherein one or more of the registers are configured to accept a frequency control word;
  a stall circuit configured to selectively disable one or more of the registers in order to stall the phase accumulator;
  a multiphase clock generator;
  a phase select circuit coupled to a multiphase clock signal from the multiphase clock generator, wherein the phase select circuit is configured to select one or more phases from the multiphase clock signal based on one or more output bits from the phase accumulator; and
  a phase interpolator coupled to an output of the phase select circuit, the phase interpolator configured to output the synthetic clock signal that is a function of the frequency control word.

18. The digital computer device of claim 17, wherein the stall circuit is coupled to one or more of the S most significant bits (MSBs) of an output from the phase accumulator, and wherein the stall circuit is configured to disable the phase accumulator based on one or more of the S MSBs.

19. The digital computer device of claim 17, wherein the phase select circuit is coupled to the stall circuit, and wherein the stall circuit is configured to inhibit the phase select circuit from outputting a signal to the phase interpolator when the stall circuit disables the phase accumulator.

20. The digital computer device of claim 17, wherein the phase select circuit is configured to output an early clock signal and a late clock signal based on the M next MSBs after the S MSBs of the output of the phase accumulator, wherein the late clock signal is one phase of the multiphase clock signal after the early clock signal, and wherein the phase interpolator is configured to interpolate the early clock signal and the late clock signal as a function of the P next MSBs after then M next MSBs of the output of the phase accumulator.

* * * * *